Dec. 13, 1955 W. F. SANDS 2,727,149
BALANCED MULTISECTION INDUCTANCE UNITS FOR
HIGH FREQUENCY SIGNAL SYSTEMS AND THE LIKE
Filed Aug. 19, 1950 2 Sheets-Sheet 1

Inventor
WILLIAM F. SANDS
By H. L. Newton
Attorney

INVENTOR
WILLIAM F. SANDS
BY H. D. Newton
ATTORNEY

United States Patent Office 2,727,149
Patented Dec. 13, 1955

2,727,149

BALANCED MULTISECTION INDUCTANCE UNITS FOR HIGH FREQUENCY SIGNAL SYSTEMS AND THE LIKE

William F. Sands, Haddonfield, N. J., assignor to Radio Corporation of America, a corporation of Delaware Application August 19, 1950, Serial No. 180,434

The terminal 15 years of the term of the patent to be granted has been disclaimed 8 Claims. (Cl. 250—40)

This invention relates to inductance units adapted for use in alternating current circuits. In particular it relates to multi-section inductance units or devices for use in high frequency signal and balanced tuning systems where the inductance ratio or balance between the various sections of such devices must be kept substantially constant.

Considerable difficulty has been experienced in developing a satisfactory inductance for tuning matched or balanced branch circuits of a radio frequency network. Particularly in inductance devices utilizing movable inductance changing core members there may be a shifting of the inductance ratio of the sections connected in the branch circuits as the core members are moved.

There are known inductance tuning systems of the balanced type employing separate core members in each inductance section and means for moving the various cores simultaneously. Tracking in the tuning between the inductance sections in such systems must be maintained throughout the tuning range. Also such systems may require complicated mechanisms for moving the various core members to accomplish this desired result. Multifilar helical windings may be used to improve the symmetrical tuning of several branch circuits in unison. Here specially wound inductance coils may be necessary, and are difficult to manufacture and connect in the proper circuit relationship. Furthermore, in some cases it is desirable that the field of each inductance coil section and each inductance coil turn be coincidental throughout the entire winding at all times. Otherwise it is generally difficult to provide a desired complete coupling between the sections. Connection leads of multi-filar windings, in particular, are generally joined in such a manner that coincidental fields are not maintained throughout the entire inductor. Particularly at high frequencies, where a short conductor represents a high inductive impedance, it is desirable to provide connection leads which do not disturb the coupling relationship between separate coil sections. It has been difficult to obtain the foregoing desired conditions in prior art devices.

It is, therefore, an object of the invention, to provide an improved multi-section inductance unit for high frequency signal circuits and the like, which may be varied without appreciably disturbing the inductance ratios between sections.

Another object of the invention therefore is to provide an inductance unit having a plurality of inductive sections so positioned that a single core member may be moved within the coincidental inductive field of the sections to simultaneously vary the inductance of each section without appreciably disturbing the overall inductance ratio or balance between the sections.

Another object of the invention is to provide a multi-section inductance unit in which the sections may be connected symmetrically in a plurality of branch circuits of a radio frequency network, and which unit may variably be tuned while maintaining the symmetrical connection of the branch circuits.

An additional object of the invention is to provide a continuously wound single conductor inductance unit which may be connected in a network to provide a multi-filar tuning effect.

A further object of the invention is to provide an inductance unit in which a plurality of series connected coil sections are disposed to provide a coincident magnetic field so that a single core member may be moved to simultaneously vary the inductance of each section by substantially the same ratio of inductance change.

A still further object of the invention is to provide a multi-section inductance unit for symmetrically tuning several branches of a high frequency circuit, to which unit branch circuit connections may readily be made.

Still further objects of the invention will become apparent from the following detailed description of the invention, when considered in connection with the accompanying drawing, in which.

Figures 1, 2, 3, 4, 5, 6, 7:
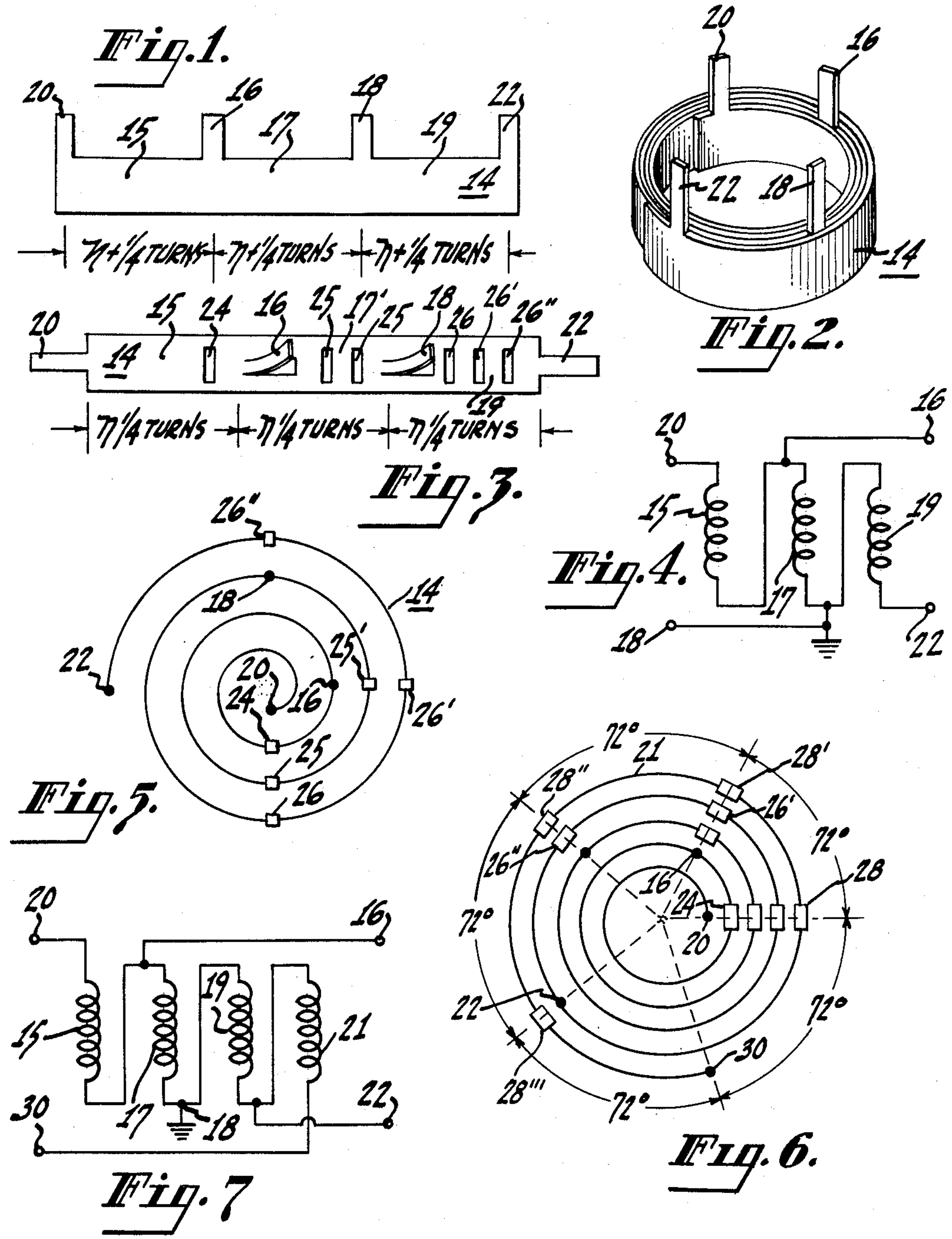
Figure 1 is a plan or top view of a preformed multi-section inductor strap or ribbon conductor, constructed in accordance with one embodiment of the invention.
Figure 2 is a view, in perspective, of a multi-section inductance unit formed from the strap conductor of Figure 1, in accordance with the invention.
Figure 3 is a plan view of a modified strap or ribbon conductor in accordance with a further embodiment of the invention.
Figure 4 is a schematic equivalent circuit representation of a tri-section inductance unit of the invention, as shown in Figure 2.
Figures 5 and 6 are expanded and elongated schematic plan views of multi-section inductance units in accordance with the invention, further to illustrate the construction and operation thereof.
Figure 7 is a schematic equivalent circuit representation of a quadri-section inductance unit adapted for construction and arrangement in accordance with the invention.

Referring to the drawing, in which like reference numerals are used to designate like parts throughout the various figures, and more particularly to Figure 1, a relatively wide strap or ribbon conductor 14 is provided, along one edge, with intermediate connection tabs 16 and 18 and end connection tabs or terminals 20 and 22. Between each of the adjacent tabs or terminals there is thereby defined a separate coil section which may be wound upon a suitable coil form to provide a unitary inductance unit having a plurality of series connected coil sections 15, 17 and 19.

In an inductance having four connection terminals or tabs, as shown in Figures 1 to 3, each coil section, as defined between consecutive connection tabs, is of a length equal to $n+\frac{1}{4}$ turns, where $n$ is an integral number times the length of one turn. This relationship is of course not restricted to equal lengths of each turn, since the thickness of the conductor straps or ribbon will cause each succeeding turn to become of a slightly greater length. Neither is an inductance unit restricted to equal inductance coil sections, as shown, since each section may comprise a different number of turns, if desired, or different amounts of inductance per unit length as will hereinafter be discussed.

The addition of the ¼ turn will, as shown in Figure 2, provide in a tri-section inductance unit connection tabs which are evenly spaced around the coil. It is noted that the coil is wound in the form of a tight spiral section and that the connection tabs extend from one edge of the uniform ribbon conductor at evenly spaced intervals about the spiral section.

In connection with the spiral wound ribbon conductor the flux or field disposition about the edge of each coil turn or coil section will be almost entirely coincidental with that of the other turns or sections, thereby passing through the center or axis portion of the spiral section. The ribbon conductor therefore provides a more complete linkage of magnetic fields in each of the coil sections than would a cylindrical conductor, and for this reason is preferred in accordance with the invention. It is to be noted however that the inductance values, the number of turns and the overall capacity between turns will cause the inductance design requirements to be chosen to meet each individual application, thereby causing the strap or ribbon dimensions to be a matter of choice. Thus, a broader ribbon may be used to provide a lower inductance value such as required at high frequencies, but it may be necessary to space the turns to decrease the winding capacity with such a ribbon.

As will hereinafter more fully be explained, an inductance-changing core member may be provided for variable movement along the axis of the spiral section thereby cutting substantially the coincident field between each section to simultaneously effect tuning by a change in the inductance of each coil section. The described embodiment thereby affords tuning of the coil sections without appreciably disturbing the overall inductance balance between the coil sections.

Figure 3 shows a modified pre-formed ribbon conductor or strap winding for a multi-section inductance. In this embodiment of the invention the conductor is designed so that the connection tabs may extend radially from the outer winding of the spiral coil into which the conductor is wound. Thus one end tab 20 and the intermediate tabs 16 and 18 are formed integral with the ribbon conductor at such positions that the tabs extend through apertures 24, 25 and 26 provided in the body of the ribbon conductor.

The physical relationship of the respective portions of the ribbon conductor, when wound in the form of a multi-section coil, will be more clearly explained in connection with Figure 5. Therein the modified ribbon conductor is schematically represented as a coil or inductor unit wound in the form of a spiral section. The coil has schematically shown, symmetrical connection tabs 16, 18, 20, 22, which may extend from the outer winding of the coil. The inner terminals or tabs extend through the schematically shown apertures 24, 25 and 26 and are positioned in the ribbon body at proper intervals. The inductance is preferably wound in the form of a tight spiral section as shown in Figure 2, to provide better flux concentration at the spiral axis as hereinbefore mentioned. The expanded spiral section is shown to better illustrate the relationship of the radially extending connection tabs afforded when the ribbon conductor of Figure 3 is used. It is to be recognized however that the flux concentration paths of a ribbon conductor will allow considerable choice in the conductor spacing, as necessary in some cases to decrease the capacity between coil windings. For this reason, and others, a ribbon conductor affords considerable advantage when used with the multi-section inductance of the present invention.

As seen in Figure 5, the connection tab 18 may extend through the aperture 26″ and therefrom, when looking clockwise around the spiral, each succeeding tab extends through a consecutively larger number of apertures. Thus, for example, connection tab 16 extends through both apertures 25′ and 26′. If single turn coil sections are desired, the strap of Figure 3 is wound into the spiral section shown. If multi-turn sections are used, it is apparent from the above description that further apertures may be provided in the further turns, as desired. The connection tabs extend radially from the spiral section and are evenly spaced about the outer periphery or turn of the coil. With the described connection tab arrangement, the multi-section inductance unit may be connected in circuit to function substantially as a multi-filar winding. There is, however, herein a complete flux linkage between the sections even in the vicinity of the connection terminals. The presently described embodiment therefore provides a convenient and novel means for providing a multi-section inductance with a continuously wound single conductor spiral coil wound from a ribbon conductor.

An enamel coating or other suitable insulation material is used to electrically isolate the adjacent winding turns and to prevent any short circuit connections which otherwise might tend to be caused by the radially extending connection tabs.

Figure 4 shows schematically an equivalent circuit diagram of the hereinbefore described multi-section inductance unit. The diagram is arranged to illustrate that by means of the present invention a continuously wound inductance device may be used for providing a multi-filar tuning effect. The described embodiments therefore will function in a manner similar to that of a tri-filar winding when used in conjunction with an inductance-changing core member which is variably inserted within the coincident fields of the coil section. Therefore a multi-filar tuning effect is accomplished with a continuously-wound single-conductor coil. The term "core member" is not meant to restrict the described device to one placed within the center or core of the spiral section. Although such a core member is preferred, because of manufacturing simplicity, a "core member" might be extended concentrically about the outer spiral winding or otherwise disposed to cut the coincident magnetic fields of the coil sections.

Figures 8, 9, 10, 11, 12:
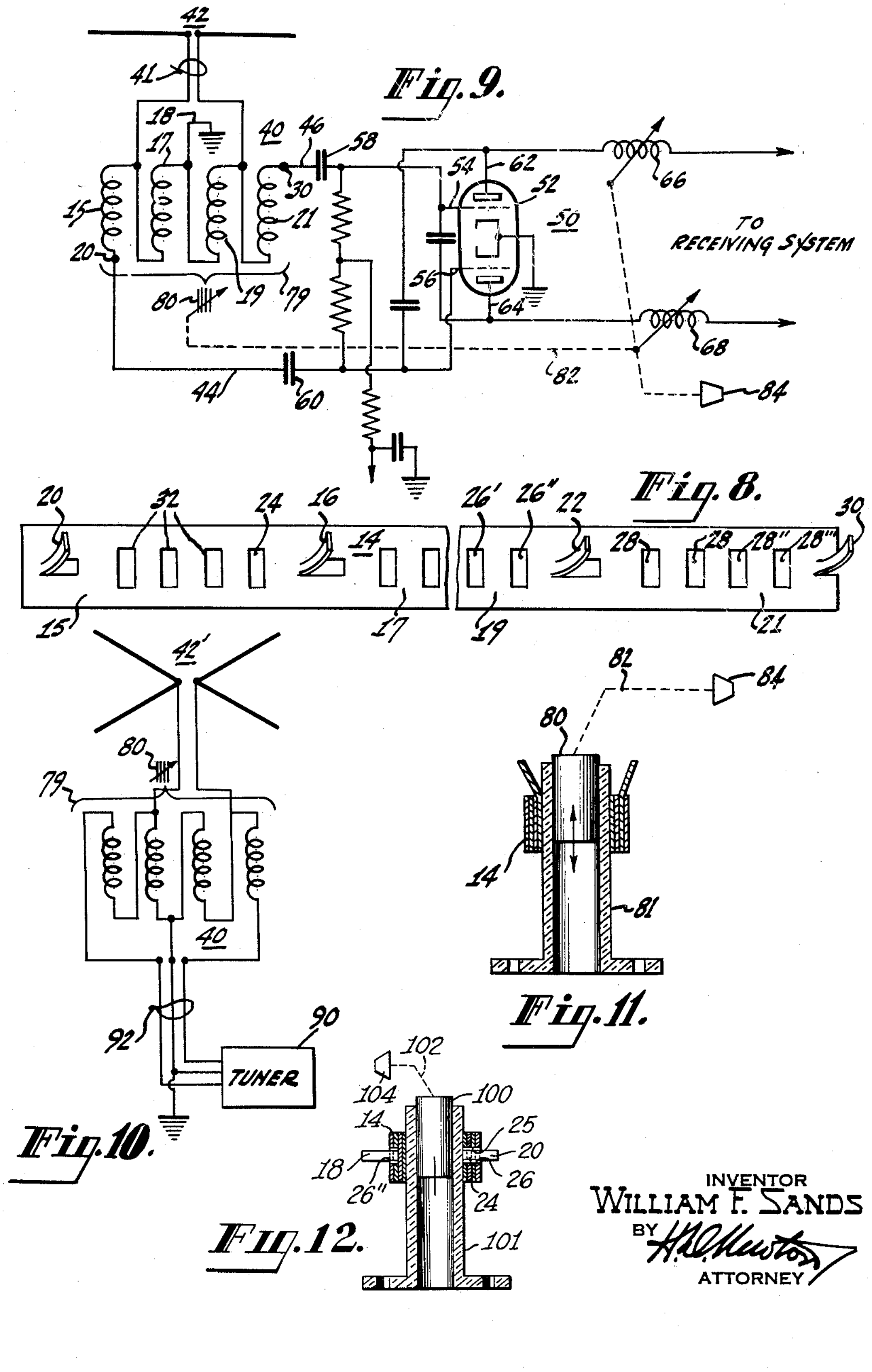
Figure 8 is a further plan view, partially broken away, of a further multi-section inductance strap or ribbon conductor constructed in accordance with the invention.
Figure 9 is a schematic circuit diagram of a variably tunable signal transfer or antenna coupling circuit for a radio signal receiving system embodying the invention.
Figure 10 is a schematic circuit diagram of an impedance transformation circuit particularly adapted for antenna coupling in accordance with the invention, as a modification of a portion of the circuit of Figure 9.
Figure 11 is a front elevation view, partially in section, of a multi-section variable inductance unit constructed and arranged in accordance with the invention; and, Figure 12 is a front elevation view, partially in section of a multi-section variable inductance unit similar to that shown in Figure 11 and illustrating a further embodiment of the invention.

Similarly, Figures 6 to 8 illustrate the manner in which a quadri-filar winding may be similated by a continuously wound ribbon conductor similar to that of Figure 3. Other configurations are made obvious by these illustrated embodiments, and it is easily recognized that other inductance or auto-transformer arrangements than those shown may fall within the spirit and scope of the invention.

Thus, in Figure 8, the end connection tabs may be constructed with a configuration identical to that of the intermediate connection tabs. This may be preferred when identical windings are desired for the separate coil-sections or a constant inductance per unit conductor length is desired. In a quadri-section winding of this type it is noted that four apertures may be used in each section. The turns of the outermost spiral coil section then require four apertures in a quadri-section unit.

As in the ribbon conductor of Figure 3, each succeeding section will have a greater number of apertures as indicated in Figure 8 by the solid rectangular blocks. The outer coil section 21 of the spiral into which the quadri-section inductance may be wound then must have four apertures 28 in each turn, whereas each succeeding coil section will have a progressingly smaller number of apertures required to permit the extension of the connection tabs through the body of the spiral windings.

As indicated, a portion of the ribbon conductor including a terminal 18, not shown in this figure, but as shown in Figure 1, has been broken away.

As indicated in the first coil section 15, by the dotted rectangular blocks 32, extra apertures may be punched in the ribbon conductor if it is desirable to keep each coil section of the same shape and inductance characteristic. Such apertures may be used to increase the value of inductance of the strap by decreasing the conductor volume, as is well known in the art. In this manner a uniformly apertured ribbon conductor may be used to provide coil sections of substantially the same inductance per unit length.

A multi-section inductance of the type described may be used in an input circuit of a radio receiver system as shown in Figure 9. The multi-section inductance is thereby used as an input circuit matching transformer 40 having four coil sections series connected to form a unitary inductor. A symmetrical signal conveying circuit such as a transmission line 41 from a dipole antenna 42 is connected across the two innermost coil sections 17 and 19 of the inductor. A ground point for the transformer then may be established at the center of the inductor at the connection tab 18.

Signal conveying connections 44, 46 are made from the end connection terminals 20, 30 of the unitary inductor or transformer 40 and are connected to the remainder of the input circuit for the radio receiving system. The input circuit may comprise a balanced radio frequency amplifier stage 50 having a twin-triode amplifying device 52 with its respective control electrodes 54 and 56 coupled to the signal conveying section by means of capacitors 58 and 60. The anode output leads 62, 64 of the device 52 are coupled through a pair of variably tuned inductors 66, 68 to the remainder of the radio receiving system. A single tuning core 80 is provided for tuning or varying the inductance of each section of the input transformer 40 as indicated in the drawing by the bracket 79.

In accordance with the invention, therefore, the inductance of the separate coil sections may be changed without appreciably disturbing the inductance balance between the coil sections. Thus, the transformer may variably provide a continuous balance impedance match between the input signal conveying circuit and the balance of a radio receiver system. The core member 80 is interconnected for variable movement within the transformer magnetic field by means of a control mechanism actuated by a tuning control knob 84, as shown by the dotted line 82. Tuning control mechanisms are well known in the art and, therefore, need not be described herein in further detail.

The variably tuned inductors 66 and 68 are linked with the tuning mechanism for unicontrol operation with the core member 80. This embodiment of the invention therefore comprises a radio receiving system which may be variably tuned over a wide tuning range while maintaining a continuously balanced impedance match between the input signal conveying circuit and the remainder of the receiver system.

An input circuit matching transformer such as that described has become known in the art as an elevator transformer, when connected to the antenna input circuit of a television receiver or the like. In such circuits it is well known that the antenna impedance and the receiver input impedance changes as the signal frequency of the receiving system is changed. However, it is desirable to keep an essentially constant ratio of inductance between the separate coil sections for all frequencies. Therefore, the presently described multi-section inductance is well adapted for use in tuning such a system over a prescribed frequency range and provides improved operation of the system when used in this manner.

A further impedance transformation circuit is shown in Figure 10, which is used in connecting a broad band antenna 42' to a tuner 90 of a radio receiving system, or the like. It is noted that a three wire cable 92 having a grounded center conductor connects the transformer 40 to the tuner 90. Thus the transformer 40 may comprise an antenna matching unit which is mounted in the vicinity of the antenna.

The transformer may have an adjustable core 80 which operates similarly to that described above and which may either be initially adjusted to the proper position or remotely adjusted by a continuously variable mechanism. The three wire conductor 92 shown may be desirable in providing protection from lightning discharges and the like, since the center wire is grounded. As in the above mentioned elevator transformer device, the overall inductance may be varied appreciably by the core member 80 without appreciably changing or disturbing the inductance balance of the different transformer coil sections.

Figure 11 shows a multi-section inductance, of the type described and of the form shown in Figure 2, comprising a ribbon conductor 14 wound into a spiral coil upon a coil form 81. Within the coil form 81 an inductance-changing core member 80 is variably inserted to cut the substantially coincidental magnetic field of the coil sections. A tuning control knob 84 may be linked with the core member by any suitable tuning control means. It will be recognized by those skilled in the art, that in using a spiral wound coil and particularly in using a ribbon wound spiral section, the magnetic field of each coil section will be almost completely linked through the spiral axis at the center of the coil in such a manner that the inductance of each coil section is changed with relative movement of the core without appreciably disturbing the inductance ratios between the respective sections.

Figure 12 also shows a multi-section inductance of the type described and of the form shown in Figure 5, comprising a ribbon conductor 14 wound into a spiral coil upon a coil form 101. Within the coil form 101, an inductance changing core member 100 is variably inserted to cut the substantially coincidental magnetic field of the coil section. A tuning knob 104 may be linked with the core member by any suitable control tuning means 102. As described in connection with Figure 5, the connection tab 18 extends through the aperture 26'' in the next outer turn of the ribbon conductor 14, and the connection tab 20 extends through the apertures 24, 25 and 26 in the successive turns of the conductor.

There is therefore provided in accordance with the invention a multi-section inductance comprising a single-conductor, tapped winding which is particularly adapted for tuning a plurality of branch circuits in a radio frequency network without shifting the inductance ratios between the branch circuits. The specific embodiments of the invention provide a multi-section inductor which is easily wound and is inexpensive to manufacture, yet which affords essentially complete coupling between the coil sections.

What is claimed is:

1. In a network for providing a multi-filar tuning effect with a continuously-wound, single-conductor coil, an inductance unit comprising a ribbon conductor in the form of a spiral section a plurality of intermediate connection tabs located at predetermined positions on one side of said conductor and extending radially therefrom, the sections of said conductor between said tabs each defining a tunable inductance element, said inductance elements being connected in series relationship and being disposed to provide substantially coincident fields between each inductance element, whereby an inductance-changing core member in said fields may tune each section without appreciably disturbing the overall inductance balance between the coil sections.

2. An inductor unit as defined in claim 1 wherein said conductor comprises a ribbon of substantially uniform width and cross-section having the intermediate connection tabs extending in a radial direction from the outside edge of the ribbon, whereby said tabs extend at evenly spaced intervals from and about said spiral section.

3. An inductor unit as defined in claim 1 wherein said conductor comprises a ribbon apertured at predetermined intervals along its length and said inductance unit has connection tabs extending radially outwardly from the spiral, the connection tabs being integral with the ribbon conductor and extending from the ribbon body at such positions that the tabs protrude through the ribbon apertures when the ribbon is wound in said spiral section thereby providing connection points to the series connected coil sections.

4. An inductor unit as defined in claim 3 wherein said ribbon is apertured substantially uniformly between each of said connection tabs, thereby to provide an inductor wherein each of said series coil sections has substantially the same inductance per unit length.

5. An inductor unit as defined in claim 1 wherein an inductance-changing core member is variably movable within said coincident fields of the coil sections.

6. An inductor unit comprising a ribbon conductor apertured at predetermined intervals along its length and wound in a spiral section, and connection tabs integral with said ribbon conductor extending in a direction outwardly substantially radially from the axis of the spiral and from the outermost turn of the ribbon conductor at such points that the tabs extend through the apertured ribbon at predetermined intervals to provide connection points external to said spiral section, thereby forming a plurality of series connected coil sections.

7. An inductor unit as defined in claim 6 wherein each coil section of said ribbon conductor is symmetrically apertured with respect to each other whereby each section has substantially the same inductance per unit length.

8. An inductor unit as defined in claim 6 wherein the tabs are evenly spaced along the circumference of the outer periphery of the spiral section.

References Cited in the file of this patent

UNITED STATES PATENTS

| | | |
|---|---|---|
| 1,227,521 | Balsille | May 22, 1917 |
| 1,339,772 | Lowenstein | May 11, 1920 |
| 1,502,460 | Clark | July 22, 1924 |
| 1,885,959 | Stevens | Nov. 1, 1932 |
| 1,969,746 | Gebhard et al. | Aug. 14, 1934 |
| 2,126,541 | DeForest | Aug. 9, 1938 |
| 2,137,392 | Cobb | Nov. 22, 1938 |
| 2,141,573 | Vogt | Dec. 27, 1938 |
| 2,182,071 | Crossley | Dec. 5, 1939 |
| 2,482,393 | Wilburn | Sept. 20, 1949 |
| 2,493,746 | Bowden | Jan. 10, 1950 |
| 2,516,287 | Aske | July 25, 1950 |
| 2,518,930 | Polydoroff | Aug. 15, 1950 |